(12) United States Patent
Yang et al.

(10) Patent No.: US 11,515,404 B2
(45) Date of Patent: Nov. 29, 2022

(54) SEMICONDUCTOR STRUCTURE COMPRISING REGIONS HAVING AN ISOLATION TRENCH WITH A STEPPED BOTTOM SURFACE THEREBETWEEN AND METHOD OF FORMING THE SAME

(71) Applicant: UNITED MICROELECTRONICS CORP., Hsin-Chu (TW)

(72) Inventors: Tsung-Yu Yang, Chiayi County (TW); Shin-Hung Li, Nantou County (TW); Ruei-Jhe Tsao, New Taipei (TW); Ta-Wei Chiu, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 37 days.

(21) Appl. No.: 17/160,427

(22) Filed: Jan. 28, 2021

(65) Prior Publication Data
US 2022/0223720 A1    Jul. 14, 2022

(30) Foreign Application Priority Data
Jan. 14, 2021   (CN) .......................... 202110047083.X (51) Int. Cl.
*H01L 29/66* (2006.01)
*H01L 29/06* (2006.01)
(Continued)

(52) U.S. Cl.
CPC .. *H01L 29/66795* (2013.01); *H01L 21/76229* (2013.01); *H01L 21/76232* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/0649; H01L 29/0653; H01L 21/823481;
(Continued)

(56) References Cited

U.S. PATENT DOCUMENTS 9,443,962 B2   9/2016   Ching
9,595,611 B2   3/2017   Kim
(Continued)

FOREIGN PATENT DOCUMENTS

KR    101153158    7/2012

*Primary Examiner* — Younes Boulghassoul
(74) *Attorney, Agent, or Firm* — Winston Hsu (57) ABSTRACT

A semiconductor structure includes a substrate having a first region and a second region around the first region. A first fin structure is disposed within the first region. A second fin structure is disposed within the second region. A first isolation trench is disposed within the first region and situated adjacent to the first fin structure. A first trench isolation layer is disposed in the first isolation trench. A second isolation trench is disposed around the first region and situated between the first fin structure and the second fin structure. The bottom surface of the second isolation trench has a step height. A second isolation layer is disposed in the second isolation trench.

18 Claims, 8 Drawing Sheets

(51) Int. Cl.
*H01L 21/8234* (2006.01)
*H01L 29/78* (2006.01)
*H01L 27/11* (2006.01)
*H01L 21/762* (2006.01)
*H01L 21/8238* (2006.01)
*H01L 29/08* (2006.01)
*H01L 27/092* (2006.01)
*H01L 27/02* (2006.01)

(52) U.S. Cl.
CPC ............... *H01L 21/823431* (2013.01); *H01L 21/823814* (2013.01); *H01L 21/823821* (2013.01); *H01L 21/823878* (2013.01); *H01L 27/0924* (2013.01); *H01L 27/1104* (2013.01); *H01L 29/0653* (2013.01); *H01L 29/0847* (2013.01); *H01L 29/66636* (2013.01); *H01L 29/7848* (2013.01); *H01L 29/7851* (2013.01); *H01L 27/0207* (2013.01)

(58) Field of Classification Search
CPC ....... H01L 21/823878; H01L 21/76224; H01L 21/76229; H01L 21/76232; H01L 27/0207; H01L 27/1104; H01L 21/823418; H01L 21/823814; H01L 29/0847; H01L 29/7848; H01L 29/66636
See application file for complete search history.

(56) References Cited

U.S. PATENT DOCUMENTS

| | | | |
|---|---|---|---|
| 9,735,158 B2 | 8/2017 | Kim | |
| 9,793,174 B1 | 10/2017 | Huang | |
| 10,541,253 B2 | 1/2020 | Cheng | |
| 2016/0211168 A1* | 7/2016 | Paak | H01L 21/76232 |
| 2018/0342607 A1* | 11/2018 | Hu | H01L 21/02255 |
| 2019/0097056 A1* | 3/2019 | Kuo | H01L 29/66795 |
| 2020/0194440 A1* | 6/2020 | Lim | H01L 21/823814 |
| 2021/0265224 A1* | 8/2021 | Lin | H01L 21/823878 |
| 2021/0313181 A1* | 10/2021 | Chen | H01L 21/823481 |

* cited by examiner

SEMICONDUCTOR STRUCTURE COMPRISING REGIONS HAVING AN ISOLATION TRENCH WITH A STEPPED BOTTOM SURFACE THEREBETWEEN AND METHOD OF FORMING THE SAME

BACKGROUND OF THE INVENTION

1. Field of the Invention

The present invention relates to the field of semiconductor technology, in particular to a semiconductor structure and a manufacturing method thereof.

2. Description of the Prior Art

It is known that in an advanced semiconductor manufacturing process, in order to improve the operating efficiency of the device, epitaxial SiGe layers are usually formed in the drain and source regions of the PMOS transistor.

However, in an integrated circuit with a very small pitch, for example, a static random access memory macro (SRAM macro), especially two adjacent pull-up transistors or PL transistors in an SRAM cell, SiGe bridge may occur, causing short circuit problems.

SUMMARY OF THE INVENTION

It is one object of the present invention to provide an improved semiconductor structure and its manufacturing method to solve the above-mentioned shortcomings or deficiencies of the prior art.

One aspect of the invention provides a semiconductor structure including a substrate having a first region and a second region around the first region; at least one first fin structure disposed within the first region; at least one second fin structure disposed within the second region; a first isolation trench disposed within the first region and situated adjacent to the at least one first fin structure; a first trench isolation layer in the first isolation trench; a second isolation trench disposed around the first region and situated between the at least one first fin structure and the at least one second fin structure, wherein a bottom surface of the second isolation trench has a step height; and a second isolation layer in the second isolation trench.

According to some embodiments, the bottom surface comprises a first surface within the first region and a second surface within the second region, wherein the first surface is lower than the second surface.

According to some embodiments, a top surface of the first trench isolation layer is coplanar with a top surface of the second trench isolation layer.

According to some embodiments, the first region is a PMOS region and the second region is an NMOS region.

According to some embodiments, the second region surrounds the first region.

According to some embodiments, a top surface of the at least one first fin structure is lower than a top surface of the at least one second fin structure.

According to some embodiments, the semiconductor structure further comprises: a first gate disposed on the at least one first fin structure; a first source region disposed on the at least one first fin structure and adjacent to the first gate; and a first drain region disposed on the at least one first fin structure and adjacent to the first gate.

According to some embodiments, the first source region and the first drain region comprise an epitaxial SiGe layer.

According to some embodiments, the semiconductor structure further comprises: a second gate disposed on the at least one second fin structure; a second source region disposed on the at least one second fin structure and adjacent to the second gate; and a second drain region disposed on the at least one second fin structure and adjacent to the second gate.

According to some embodiments, the second source region and the second drain region comprise an epitaxial SiP layer.

Another aspect of the invention provides a method of forming a semiconductor structure. A substrate having a first region and a second region around the first region is provided. The substrate is etched to form a recess in the first region. A trench isolation process is performed to form a first isolation trench within the first region, at least one first fin structure within the first region, a second isolation trench around the first region, at least one second fin structure within the second region, a first trench isolation layer in the first isolation trench, and a second isolation layer in the second isolation trench. The second isolation trench is situated between the at least one first fin structure and the at least one second fin structure. The bottom surface of the second isolation trench has a step height.

According to some embodiments, the bottom surface comprises a first surface within the first region and a second surface within the second region, wherein the first surface is lower than the second surface.

According to some embodiments, a top surface of the first trench isolation layer is coplanar with a top surface of the second trench isolation layer.

According to some embodiments, the first region is a PMOS region and the second region is an NMOS region.

According to some embodiments, the second region surrounds the first region.

According to some embodiments, a top surface of the at least one first fin structure is lower than a top surface of the at least one second fin structure.

According to some embodiments, the method further comprises: forming a first gate on the at least one first fin structure; forming a first source region on the at least one first fin structure and adjacent to the first gate; and forming a first drain region on the at least one first fin structure and adjacent to the first gate.

According to some embodiments, the method further comprises: forming an epitaxial SiGe layer on the first source region and the first drain region.

According to some embodiments, the method further comprises: forming a second gate on the at least one second fin structure; forming a second source region on the at least one second fin structure and adjacent to the second gate; and forming a second drain region on the at least one second fin structure and adjacent to the second gate.

According to some embodiments, the method further comprises: forming an epitaxial SiP layer on the second source region and the second drain region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
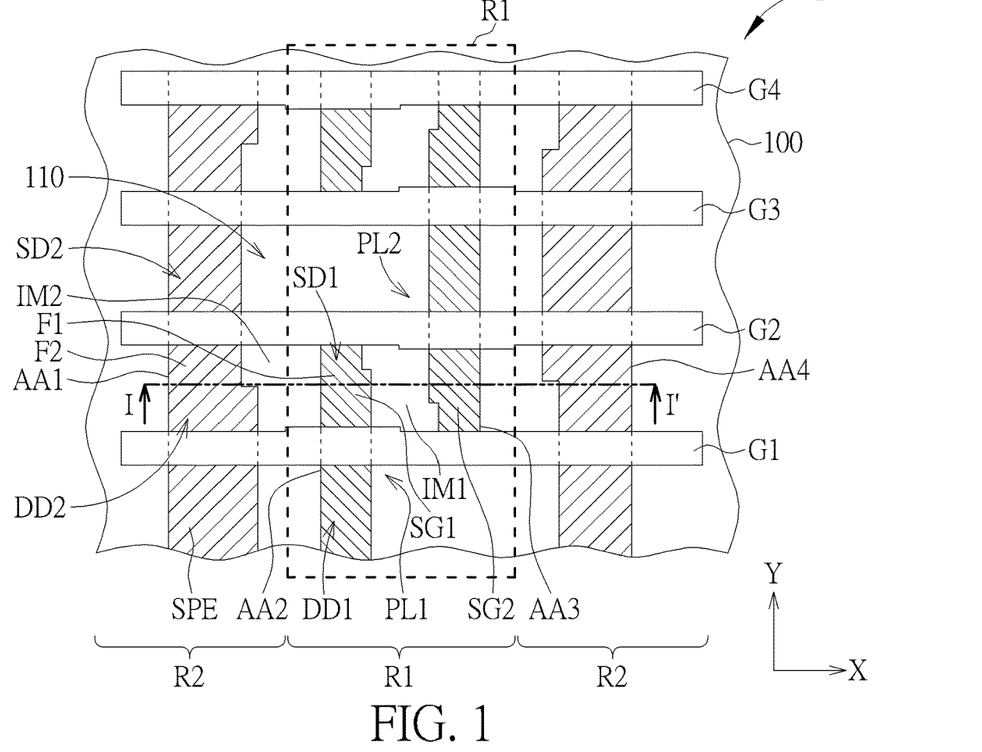
FIG. 1 is a top view of a semiconductor structure according to an embodiment of the invention.
Figure 2:
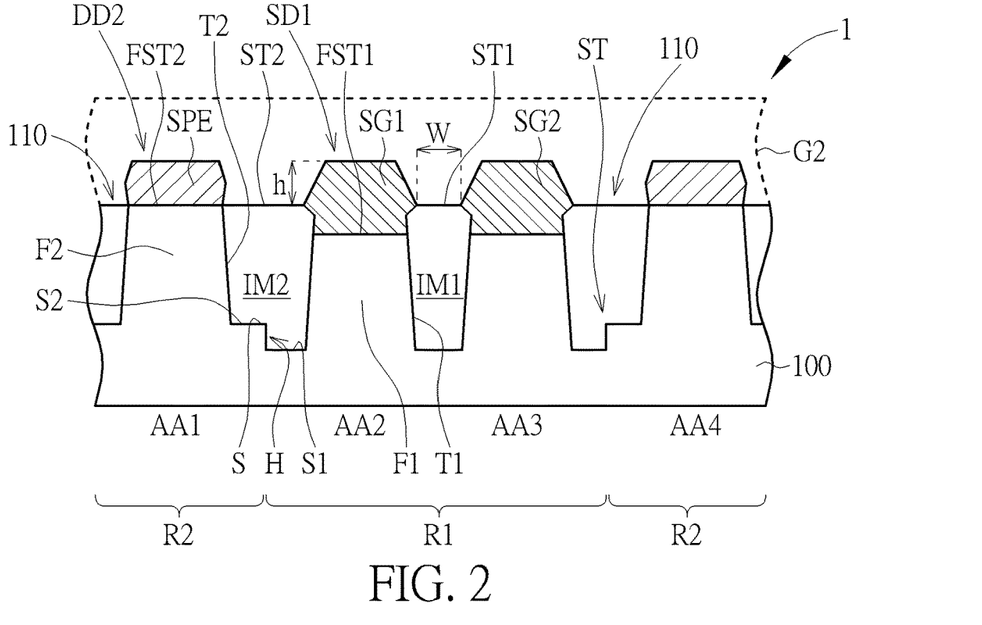
FIG. 2 is a schematic cross-sectional view taken along the line I-I' in FIG. 1.

Please refer to FIG. 1 and FIG. 2. FIG. 1 is a top view of a semiconductor structure according to an embodiment of the present invention. FIG. 2 is a schematic cross-sectional view taken along the line I-I' in FIG. 1. As shown in FIG. 1 and FIG. 2, the semiconductor structure 1 includes a substrate 100, for example, a silicon substrate, having a first region R1 and a second region R2 around the first region R1. According to an embodiment of the present invention, the second region R2 may surround the first region R1.

According to an embodiment of the present invention, the semiconductor structure 1 may be, for example, a part of a static random access memory, wherein the first region R1 may be the area as indicated by the dotted line. For example, the first region R1 includes at least two PMOS pull-up transistors PL1 and PL2. According to an embodiment of the present invention, the first region R1 may be a PMOS region, that is, only PMOS transistors are provided in the first region R1, and the second region R2 may be an NMOS region, that is, only NMOS transistors are provided in the second region R2.

In FIG. 1, four active regions AA1 to AA4 extending along the reference Y axis and four gates G1 to G4 extending along the reference X axis are illustrated. According to an embodiment of the present invention, the gate G1 crosses the active area AA2 to form a PMOS pull-up transistor PL1, and the gate G2 crosses the active area AA3 to form a PMOS pull-up transistor PL2. Between the active regions AA1 to AA4 is a shallow trench isolation (STI) region 110.

As shown in FIG. 2, the semiconductor structure 1 includes at least one first fin structure F1 disposed in the first region R1, and at least one second fin structure F2 disposed in the second region R2. In the first region R1, a first isolation trench T1 is provided adjacent to the first fin structure F1. A first trench isolation layer IM1 such as a silicon oxide layer, is provided in the first isolation trench T1. Around the first region R1, a second isolation trench T2 is provided. The second isolation trench T2 is located between the first fin structure F1 and the second fin structure F2. A second trench isolation layer IM2, such as a silicon oxide layer, is provided in the second isolation trench T2.

According to an embodiment of the present invention, the bottom surface S of the second isolation trench T2 has a step height H. According to an embodiment of the present invention, the bottom surface S of the second isolation trench T2 includes a first surface S1 in the first region R1 and a second surface S2 in the second region R2, and the first surface S1 is lower than the second surface S2, thereby constituting the step height H at the interface between the first region R1 and the second region R2. According to an embodiment of the present invention, for example, the step height H is about 30-100 angstroms, but it is not limited thereto.

According to an embodiment of the present invention, the top surface ST1 of the first trench isolation layer IM1 and the top surface ST2 of the second trench isolation layer IM2 are coplanar. According to an embodiment of the present invention, the top surface FST1 of the first fin structure F1 is lower than the top surface FST2 of the second fin structure F2.

According to an embodiment of the present invention, as shown in FIG. 1, the gate G1 of the semiconductor structure 1 may be disposed on the first fin structure F1. According to an embodiment of the present invention, a first source region SD1 adjacent to the gate G1, for example, a $P^+$ doped region, is provided on the first fin structure F1. According to an embodiment of the present invention, a first drain region DD1 adjacent to the gate G1, for example, a $P^+$ doped region, is provided on the first fin structure F1. The gate G1, the first source region SD1 and the first drain region DD1 may constitute the PMOS pull-up transistor PL1. According to an embodiment of the present invention, the first source region SD1 and the first drain region DD1 include an epitaxial SiGe layer SG1, which has a height h of about 5-25 nm above the top surface ST1 of the first trench isolation layer EVIL but not limited to this. The distance W between the epitaxial SiGe layer SG1 and the adjacent epitaxial SiGe layer SG2 on the top surface ST1 of the first trench isolation layer IM1 is at least 20 nm, for example, between 20 and 60 nm. Therefore, the semiconductor structure 1 of the present invention can effectively avoid the short circuit problem caused by the SiGe bridge.

According to an embodiment of the present invention, the gate G2 of the semiconductor structure 1 may be disposed on the second fin structure F2. According to an embodiment of the present invention, a second source region SD2 adjacent to the gate G2, for example, an $N^+$ doped region, is provided on the second fin structure F2. According to an embodiment of the present invention, a second drain region DD2 adjacent to the gate G2, for example, an $N^+$ doped region, is provided on the second fin structure F2. The gate G2, the second source region SD2 and the second drain region DD2 can constitute an NMOS transistor. According to an embodiment of the present invention, the second source region SD2 and the second drain region DD2 include an epitaxial SiP layer SPE.

Figure 3:
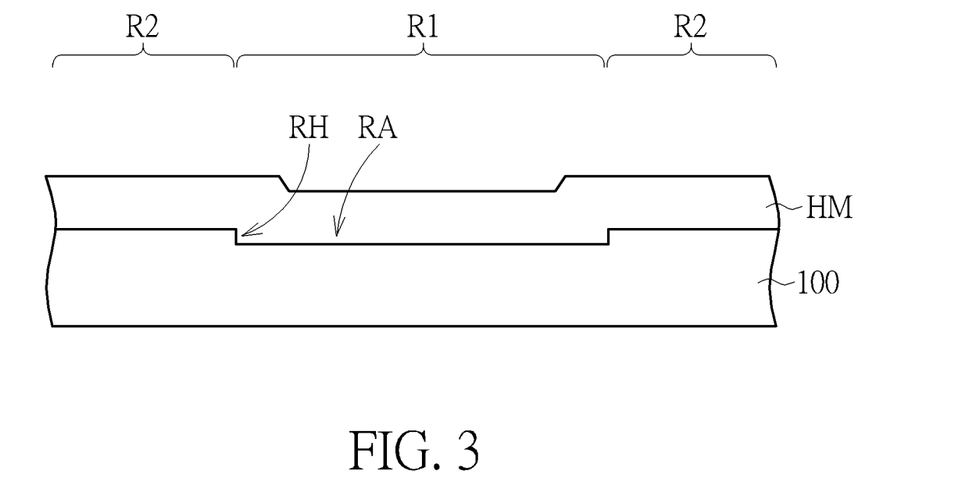
FIG. 3 to FIG. 15 illustrate a method of forming a semiconductor structure.

FIG. 3 to FIG. 15 illustrate a method of forming a semiconductor structure. As shown in FIG. 3, first, a substrate 100, such as a silicon substrate, is provided with a first region R1 and a second region R2 around the first region R1. According to an embodiment of the present invention, the second region R2 may surround the first region R1. According to an embodiment of the present invention, the first region R1 may be a PMOS region, that is, only PMOS transistors are provided in the first region R1, and the second region R2 may be an NMOS region, that is, only NMOS transistors are provide in the second region R2.

Subsequently, using a lithographic process and etching process, the substrate 100 in the first region R1 is etched to form a recess RA in the first region R1, and a step height RH is formed at the interface between the first region R1 and the second region R2. According to an embodiment of the present invention, for example, the step height RH is about 30-100 angstroms, but it is not limited thereto. A hard mask layer HM is then deposited on the substrate 100 in a blanket manner. The hard mask layer HM may include a silicon nitride layer, but is not limited thereto.

Figure 4:
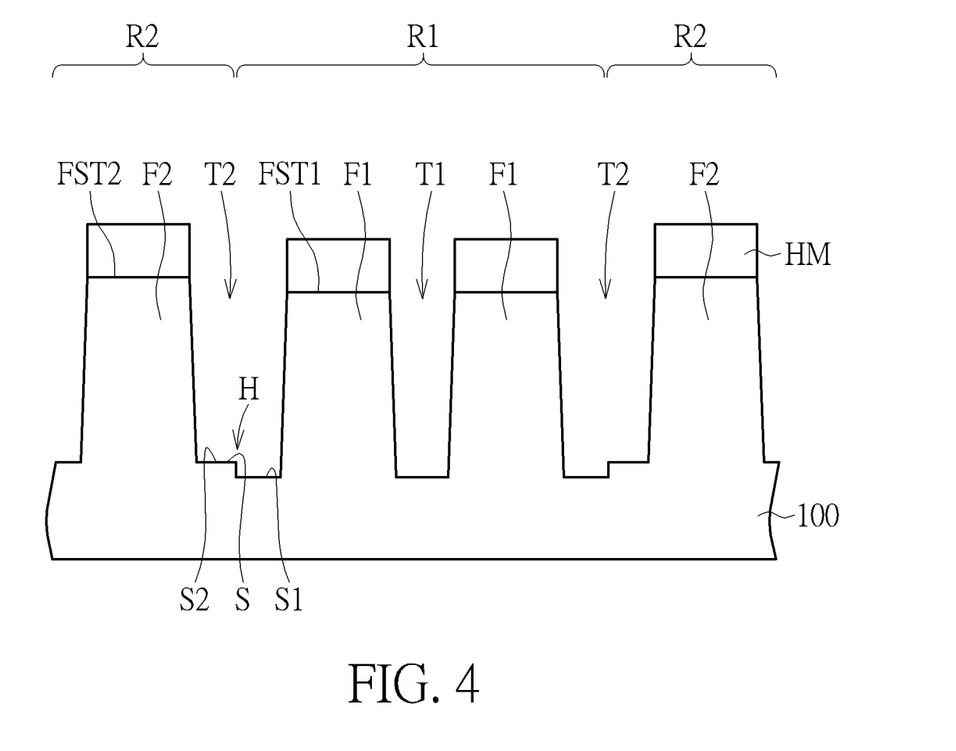

Next, as shown in FIG. 4 to FIG. 8, a trench isolation process is performed. As shown in FIG. 4, a lithographic process and an etching process may be performed to etch the hard mask layer HM and the substrate 100 in the predetermined area, and a first isolation trench T1 is formed in the first area R1, and a second isolation trench T2 is formed around the first area R1. Concurrently, at least one first fin structure F1 is formed in the first region R1, and at least one second fin structure F2 is formed in the second region R2. The second isolation trench T2 is located between the first fin structure F1 and the second fin structure F2. Between two fin-like structures F2. According to an embodiment of the present invention, for example, the top surface FST1 of the first fin structure F1 is lower than the top surface FST2 of the second fin structure F2 by about 30-100 angstroms.

According to an embodiment of the present invention, the bottom surface S of the second isolation trench T2 has a step height H. According to an embodiment of the present invention, the bottom surface S of the second isolation trench T2 includes a first surface S1 in the first region R1 and a second surface S2 in the second region R2, and the first surface S1 is lower than the first surface S1, thereby forming a step height H at the interface between the first region R1 and the second region R2. According to an embodiment of the present invention, for example, the step height H is about 30-100 angstroms, but it is not limited thereto.

Figure 5:
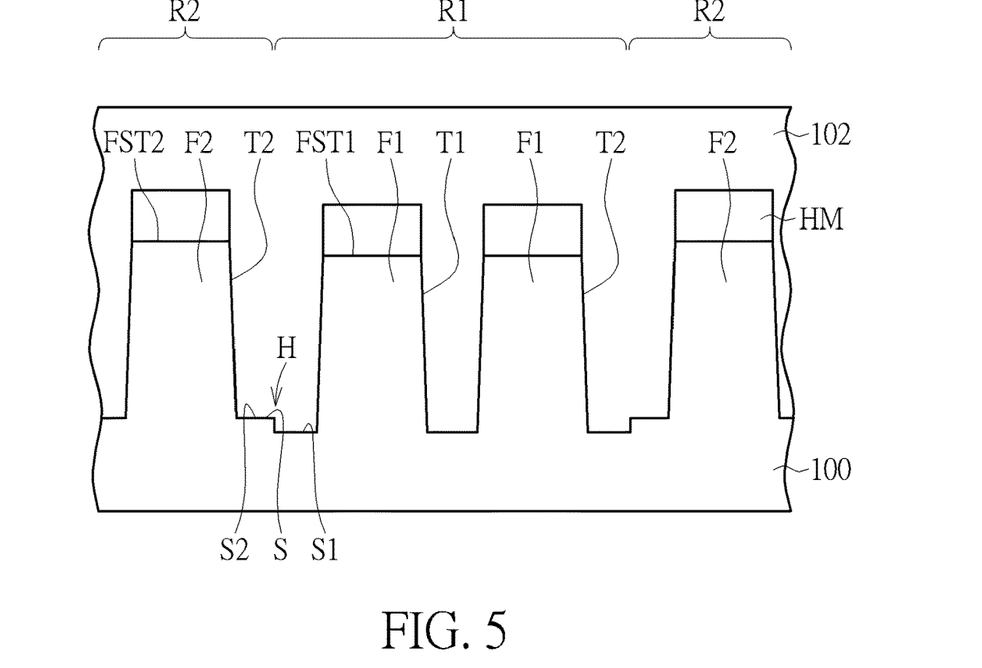

As shown in FIG. 5, a chemical vapor deposition (CVD) process is then performed to deposit an insulating layer 102, such as a silicon oxide layer, on the substrate 100 in a blanket manner. According to an embodiment of the present invention, the insulating layer 102 covers the hard mask layer HM, and fills the first isolation trench T1 and the second isolation trench T2.

Figure 6:
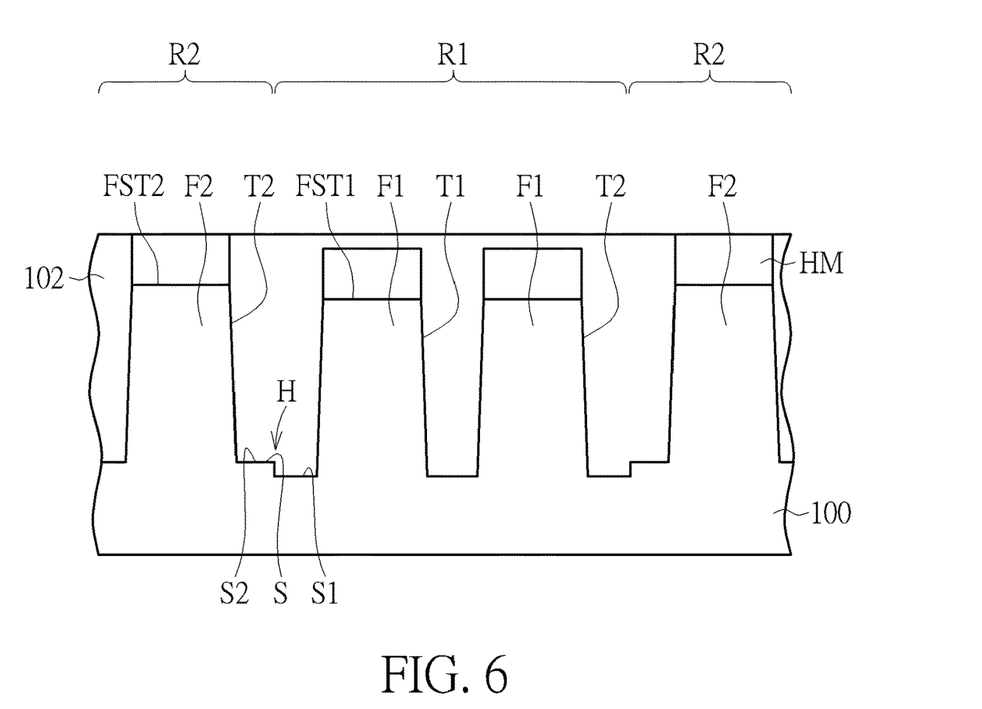

As shown in FIG. 6, the insulating layer 102 is then subjected to a planarization process, for example, a chemical mechanical polishing (CMP) process, to polish the insulating layer 102 until the top surface of the hard mask layer HM in the second region R2 is first exposed. At this point, the top surface of the hard mask layer HM in the first region R1 may still be covered by the insulating layer 102.

Figure 7:
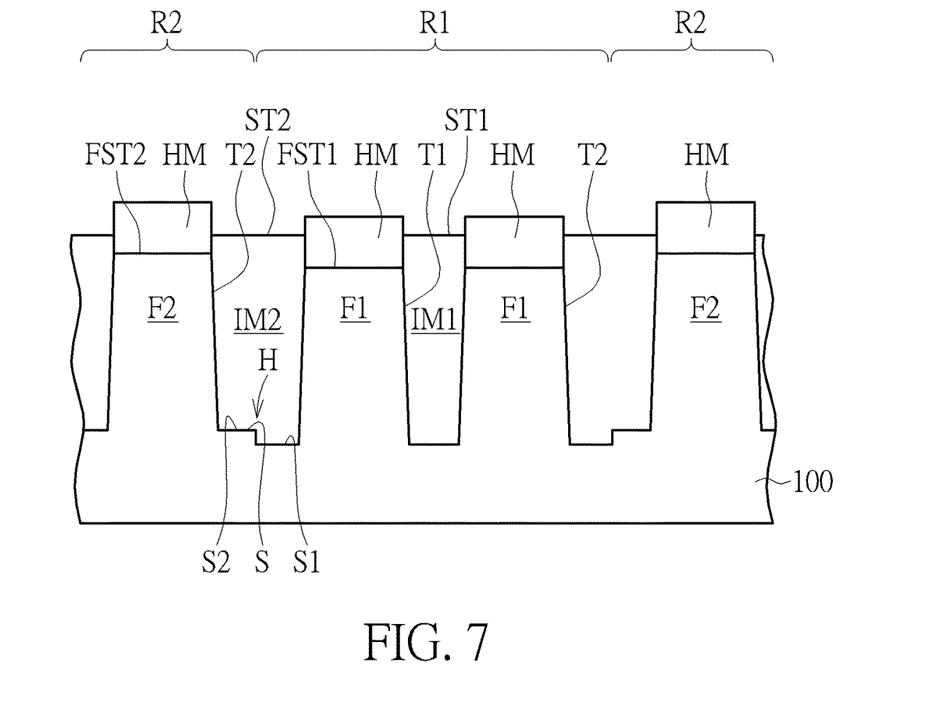

As shown in FIG. 7, an etch-back process is then performed, using dry etching or wet etching to etch away the insulating layer 102 of a predetermined thickness, revealing the top surface of the hard mask layer HM in the first region R1, so that a first trench isolation layer IM1 is formed in the first isolation trench T1, and a second trench isolation layer IM2 is formed in the second isolation trench T2. According to an embodiment of the present invention, the top surface ST1 of the first trench isolation layer IM1 and the top surface ST2 of the second trench isolation layer IM2 are coplanar.

Figure 8:
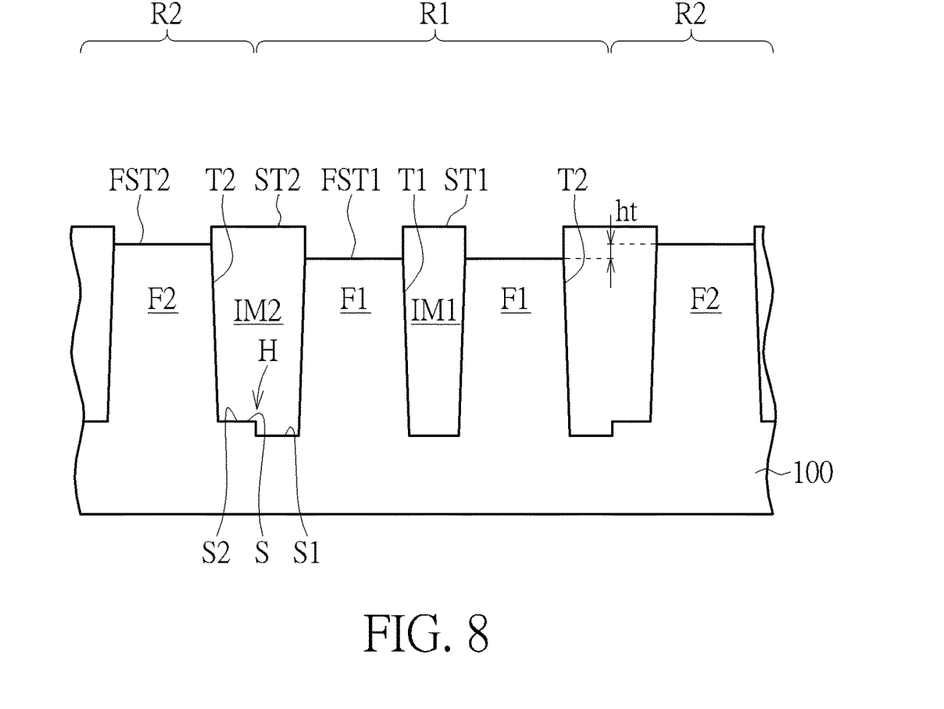

As shown in FIG. 8, an etching process, such as wet etching, is then used to remove the hard mask layer HM to reveal the top surface FST1 of the first fin structure F1 and the top surface FST2 of the second fin structure F2. According to an embodiment of the present invention, the top surface ST1 of the first trench isolation layer IM1 and the top surface ST2 of the second trench isolation layer IM2 are higher than the top surface FST2 of the second fin structure F2, and the top surface FST2 of the second fin structure F2 is higher than the top surface FST1 of the first fin structure F1. The height difference ht between the top surface FST2 of the second fin structure F2 and the top surface FST1 of the first fin structure F1 is about 30-100 angstroms, but is not limited thereto.

Figure 9:
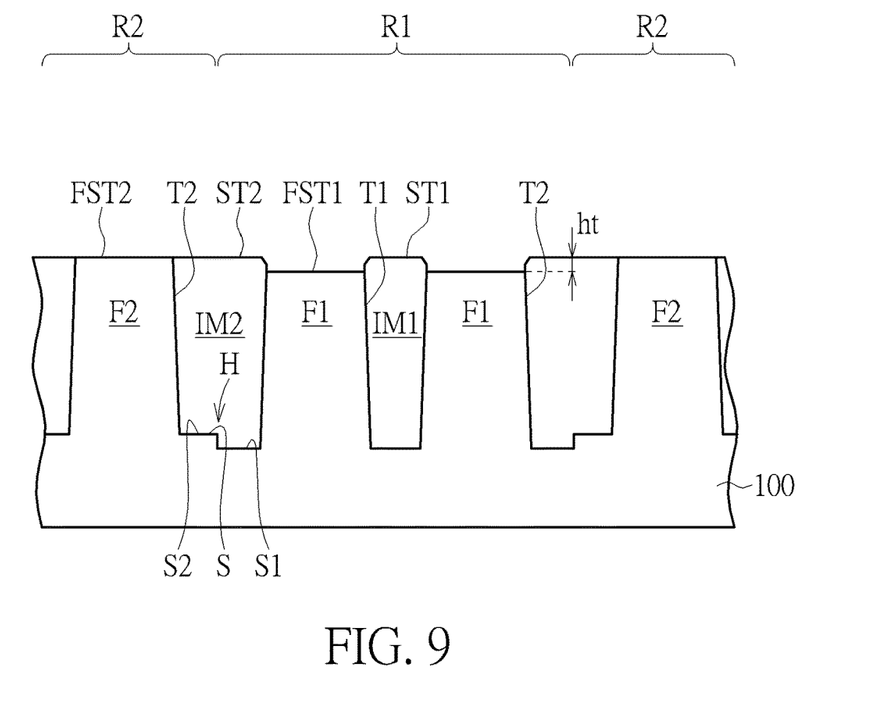

As shown in FIG. 9, an ion implantation process is then performed to form ion wells, such as P-type wells or N-type wells (not shown) in the substrate 100. Then, a cleaning process is performed. The above cleaning process may consume part of the thickness of the first trench isolation layer IM1 and the second trench isolation layer IM2, so that the top surface ST1 of the first trench isolation layer IM1 and the top surface ST2 of the second trench isolation layer IM2 will be closer to the top surface FST2 of the second fin structure F2, but still higher than the top surface FST1 of the first fin structure F1. According to an embodiment of the present invention, the height difference ht between the top surface ST1 of the first trench isolation layer IM1 and the top surface FST1 of the first fin structure F1 is about 30-100 angstroms, but is not limited thereto. In addition, after the above-mentioned cleaning process is completed, the upper corners of the first trench isolation layer IM1 will be rounded.

Figure 10:
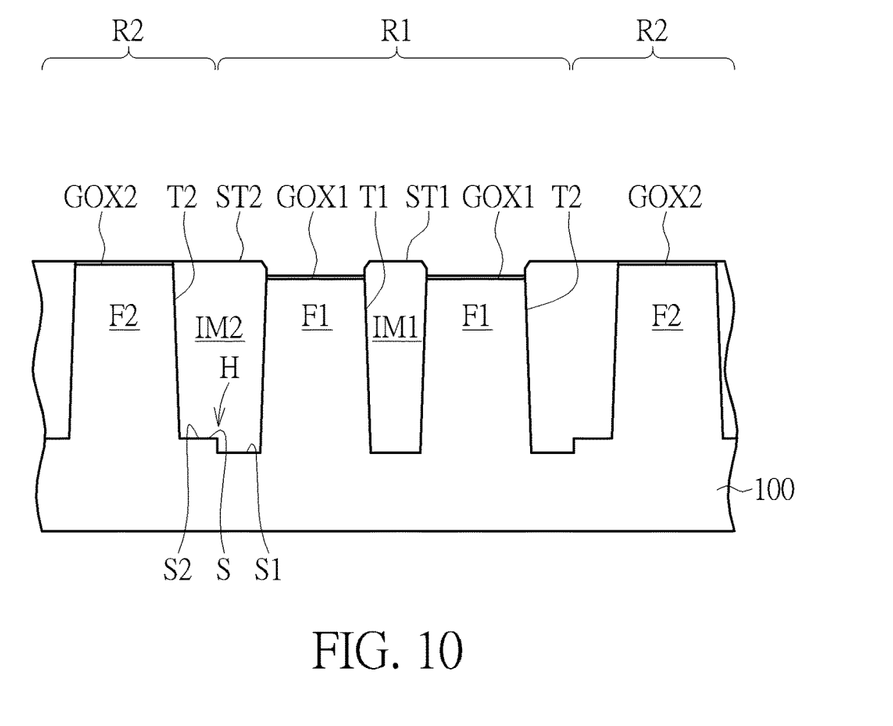

As shown in FIG. 10, an oxidation process is then performed to form a gate oxide layer GOX1 and a gate oxide layer GOX2 on the top surface FST1 of the first fin structure F1 and the top surface FST2 of the second fin structure F2, respectively. According to an embodiment of the present invention, the gate oxide layer GOX1 and the gate oxide layer GOX2 may include silicon oxide layers, but are not limited thereto. According to one embodiment, the gate oxide layer GOX1 and the gate oxide layer GOX2 may be formed of the same material. According to one embodiment, the gate oxide layer GOX1 and the gate oxide layer GOX2 may be formed of different materials.

Figure 11:
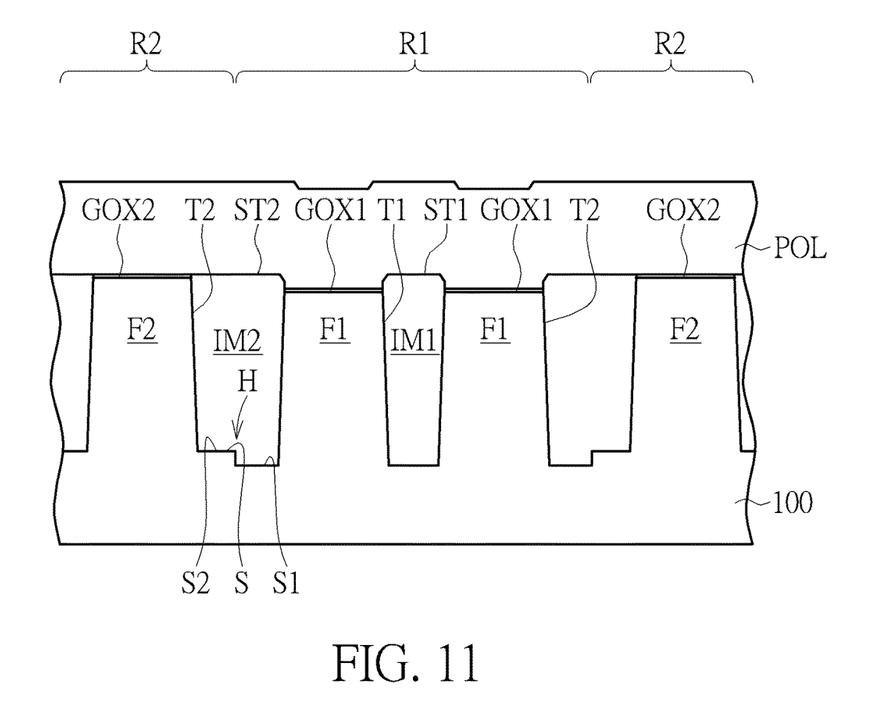

As shown in FIG. 11, a polysilicon layer POL is then deposited on the substrate 100 in a blanket manner.

Figure 12:
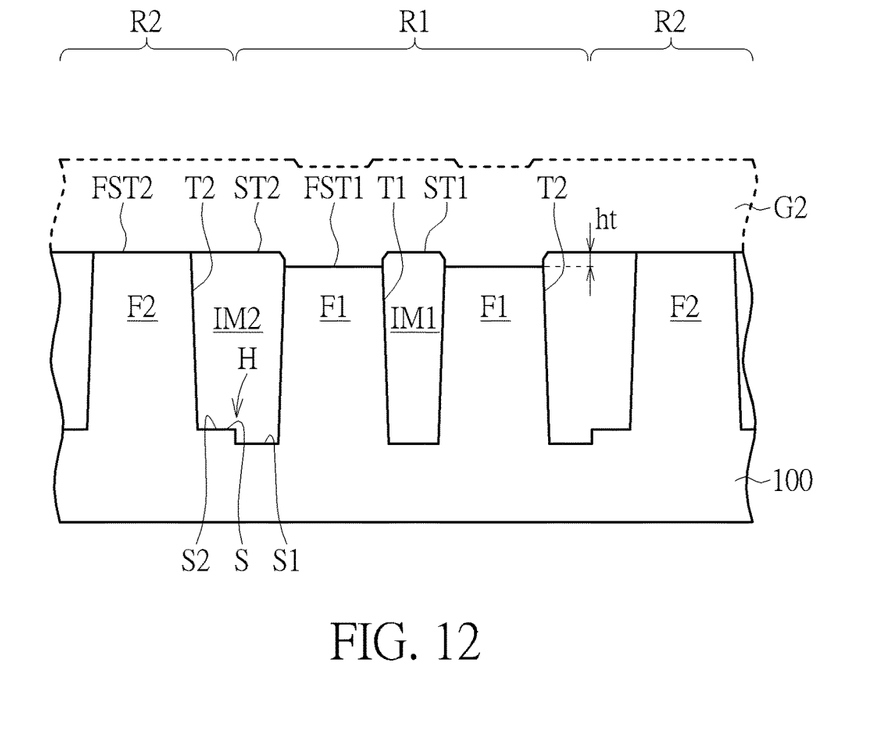

As shown in FIG. 12, the polysilicon layer POL is patterned by using a lithographic process and an etching processes to form a gate G1 on the first fin structure F1 and a gate G2 on the second fin structure F2 (as shown in FIG. 1). Since the polysilicon layer POL on this cross-section is removed, only the outline of the gate G2 is shown by dotted lines in the figure. Subsequently, spacers (not shown) can be formed on the gate G1 and the gate G2.

Figure 13:
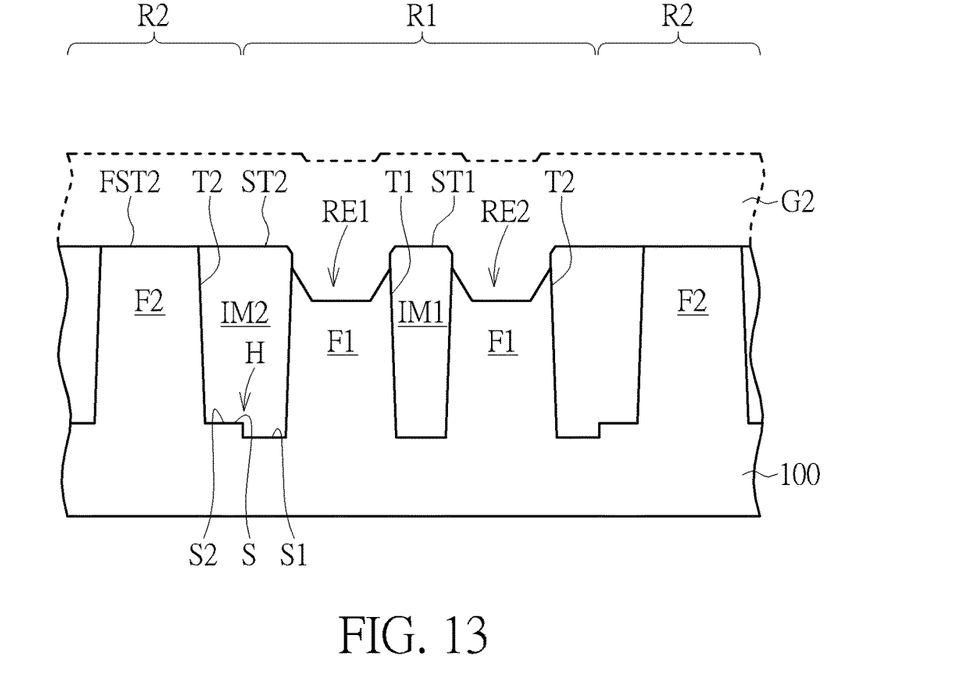

As shown in FIG. 13, a recessed region RE1 and a recessed region RE2 adjacent to the gate G1 (not shown) are then formed on the first fin structures F1 in the first region R1. The method of forming the recessed region RE1 and the recessed region RE2 on the first fin structures F1 may comprise wet etching, but is not limited thereto. According to an embodiment of the present invention, the recessed region RE1 and the recessed region RE2 are separated by the first trench isolation layer IM1. According to an embodiment of the present invention, at this point, the top surface ST1 of the first trench isolation layer IM1 and the top surface ST2 of the second trench isolation layer IM2 are still coplanar.

Figure 14:
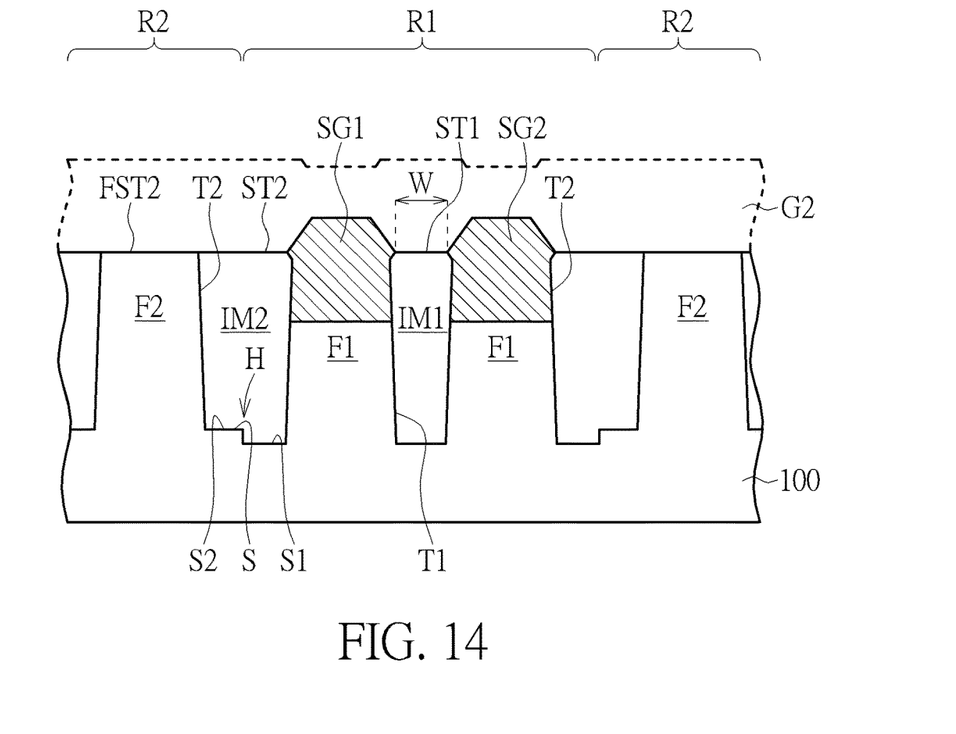

As shown in FIG. 14, an epitaxial process is then performed to form an epitaxial SiGe layer SG1 and an epitaxial SiGe layer SG2 in the recessed region RE1 and the recessed region RE2 in the first region R1, respectively. For example, the epitaxial SiGe layer SG1 and the epitaxial SiGe layer SG2 can be formed by an organometallic vapor phase epitaxy method, but are not limited thereto. During the above epitaxial process, the second region R2 can be masked. The distance W between the epitaxial SiGe layer SG1 and the adjacent epitaxial SiGe layer SG2 on the top surface ST1 of the first trench isolation layer IM1 is at least 20 nm, for example, between 20 and 60 nm. Therefore, the semiconductor structure 1 of the present invention can effectively avoid the short circuit problem caused by the SiGe bridge.

Figure 15:
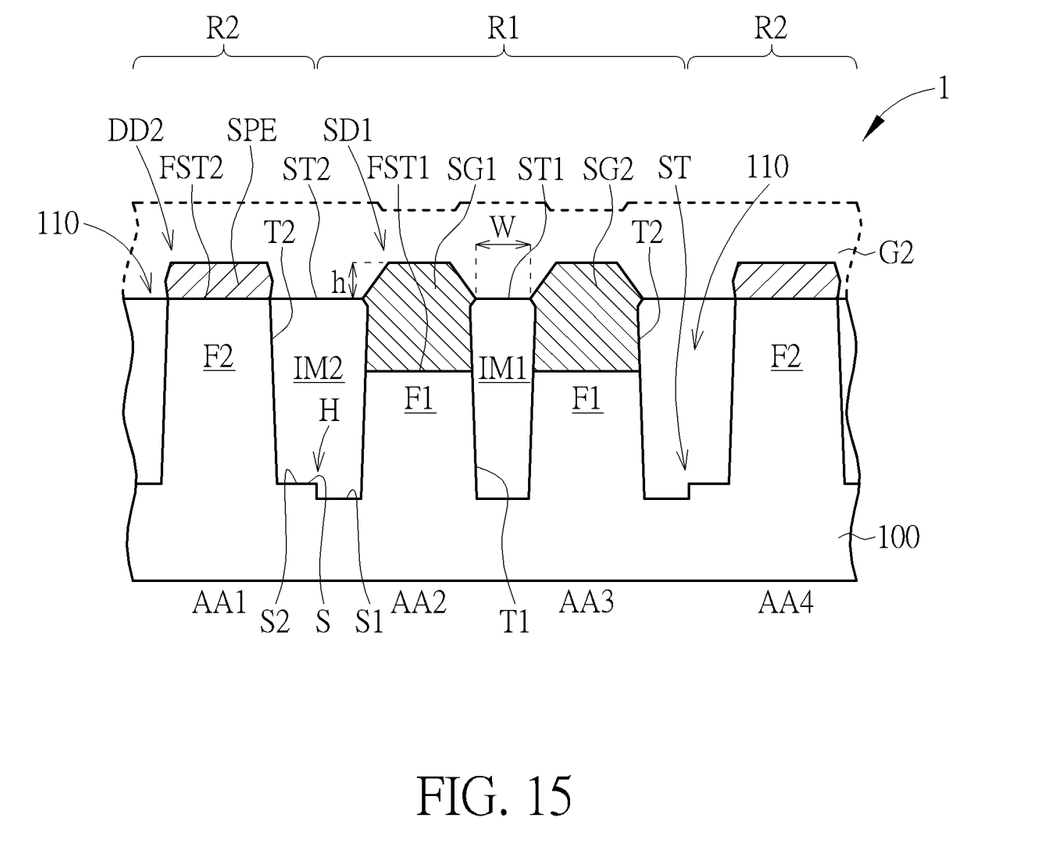

As shown in FIG. 15, the epitaxy process is performed to form an epitaxial SiP layer SPE on the second fin structure F2 in the second region R2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a first region and a second region around the first region;
   at least one first fin structure disposed within the first region;
   at least one second fin structure disposed within the second region;
   a first isolation trench disposed within the first region and situated adjacent to the at least one first fin structure;
   a first trench isolation layer in the first isolation trench;
   a second isolation trench disposed around the first region and situated between the at least one first fin structure and the at least one second fin structure, wherein a bottom surface of the second isolation trench has a step height, wherein the bottom surface comprises a first surface within the first region that is in close proximity to a second surface within the second region, wherein the step height is situated at an interface between the first region and the second region, and the first surface is lower than the second surface; and
   a second trench isolation layer in the second isolation trench.

2. The semiconductor structure according to claim 1, wherein a top surface of the first trench isolation layer is coplanar with a top surface of the second trench isolation layer.

3. The semiconductor structure according to claim 1, wherein the first region is a PMOS region and the second region is an NMOS region.

4. The semiconductor structure according to claim 1, wherein the second region surrounds the first region.

5. The semiconductor structure according to claim 1, wherein a top surface of the at least one first fin structure is lower than a top surface of the at least one second fin structure.

6. The semiconductor structure according to claim 1 further comprising:
   a first gate disposed on the at least one first fin structure;
   a first source region disposed on the at least one first fin structure and adjacent to the first gate; and
   a first drain region disposed on the at least one first fin structure and adjacent to the first gate.

7. The semiconductor structure according to claim 6, wherein the first source region and the first drain region comprise an epitaxial SiGe layer.

8. The semiconductor structure according to claim 1 further comprising:
   a second gate disposed on the at least one second fin structure;
   a second source region disposed on the at least one second fin structure and adjacent to the second gate; and
   a second drain region disposed on the at least one second fin structure and adjacent to the second gate.

9. The semiconductor structure according to claim 8, wherein the second source region and the second drain region comprise an epitaxial SiP layer.

10. A method of forming a semiconductor structure, comprising:
    providing a substrate having a first region and a second region around the first region;
    etching the substrate to form a recess in the first region; and
    after forming the recess in the first region, performing a trench isolation process to form a first isolation trench within the first region, at least one first fin structure within the first region, a second isolation trench around the first region, at least one second fin structure within the second region, a first trench isolation layer in the first isolation trench, and a second trench isolation layer in the second isolation trench, wherein the second isolation trench is situated between the at least one first fin structure and the at least one second fin structure, wherein the bottom surface of the second isolation trench has a step height, wherein the bottom surface comprises a first surface within the first region that is in close proximity to a second surface within the second region, wherein the step height is situated at an interface between the first region and the second region, and the first surface is lower than the second surface.

11. The method according to claim 10, wherein a top surface of the first trench isolation layer is coplanar with a top surface of the second trench isolation layer.

12. The method according to claim 10, wherein the first region is a PMOS region and the second region is an NMOS region.

13. The method according to claim 10, wherein the second region surrounds the first region.

14. The method according to claim 10, wherein a top surface of the at least one first fin structure is lower than a top surface of the at least one second fin structure.

15. The method according to claim 10 further comprising:
    forming a first gate on the at least one first fin structure;
    forming a first source region on the at least one first fin structure and adjacent to the first gate; and
    forming a first drain region on the at least one first fin structure and adjacent to the first gate.

16. The method according to claim 15 further comprising:
    forming an epitaxial SiGe layer on the first source region and the first drain region.

17. The method according to claim 10 further comprising:
    forming a second gate on the at least one second fin structure;
    forming a second source region on the at least one second fin structure and adjacent to the second gate; and
    forming a second drain region on the at least one second fin structure and adjacent to the second gate.

18. The method according to claim 17 further comprising:
    forming an epitaxial SiP layer on the second source region and the second drain region.

* * * * *